(12) United States Patent
Park

(10) Patent No.: US 10,797,330 B2
(45) Date of Patent: Oct. 6, 2020

(54) SYSTEM FOR MEASURING A STACK CELL VOLTAGE OF A FUEL CELL AND METHOD THEREOF

(71) Applicant: Hyundai Motor Company, Seoul (KR)

(72) Inventor: Jeong Kyu Park, Gyeonggi-Do (KR)

(73) Assignee: Hyundai Motor Company, Seoul (KR)

(*) Notice: Subject to any disclaimer, the term of this patent is extended or adjusted under 35 U.S.C. 154(b) by 729 days.

(21) Appl. No.: 14/565,458

(22) Filed: Dec. 10, 2014

(65) Prior Publication Data
US 2016/0091570 A1  Mar. 31, 2016

(30) Foreign Application Priority Data
Sep. 25, 2014 (KR) .................. 10-2014-0128681

(51) Int. Cl.
H01M 8/04537 (2016.01)
G01R 31/385 (2019.01)
(Continued)

(52) U.S. Cl.
CPC ......... H01M 8/04589 (2013.01); B60L 50/72 (2019.02); G01R 31/3865 (2019.01);
(Continued)

(58) Field of Classification Search
CPC ......... H01M 8/04589; H01M 2250/20; H01M 10/38; H01M 10/0463; H01M 10/0436; H01M 10/0481; H01M 4/04; H01M 4/13; H01M 2004/028; H01M 2004/027; H01M 8/04537; H01M 8/04544; G01R 31/3641; G01R 31/006; B60L 11/1851; B60L 11/1864; B60L 11/1868; B60L 11/1881; Y02T 90/32; Y02E 60/12
See application file for complete search history.

(56) References Cited

U.S. PATENT DOCUMENTS 6,406,806 B1  6/2002  Keskula et al.
2008/0091362 A1  4/2008  Tae et al.
(Continued)

FOREIGN PATENT DOCUMENTS

DE  102010030818 A1  2/2011
JP  2007-242529 A  9/2007
(Continued)

OTHER PUBLICATIONS

English Translation of JP2007242529.*
German Office Action for German Patent Application No. 102014225645.3, dated Dec. 4, 2018, 22 pages.

Primary Examiner — Milton I Cano
Assistant Examiner — Kiran Akhtar
(74) Attorney, Agent, or Firm — Mintz Levin Cohn Ferris Glovsky and Popeo, P.C.; Peter F. Corless

(57) ABSTRACT

A system for measuring a stack cell voltage of a fuel cell according to the present invention comprises: a stack voltage measuring unit which measures a stack voltage of a stack cell battery for each channel; a correction variable calculating unit which calculates a correction variable by using the stack voltage value measured by the stack voltage measuring unit; and a stack voltage value correcting unit which corrects the stack voltage measured by the stack voltage measuring unit on driving by using the correction variable.

4 Claims, 6 Drawing Sheets

(51) Int. Cl.
*B60L 50/72* (2019.01)
*G01R 31/00* (2006.01)

(52) U.S. Cl.
CPC ......... *B60L 2260/44* (2013.01); *G01R 31/006* (2013.01); *H01M 8/04537* (2013.01); *H01M 8/04544* (2013.01); *H01M 2250/20* (2013.01); *Y02T 90/40* (2013.01)

(56) References Cited

U.S. PATENT DOCUMENTS

| | | |
|---|---|---|
| 2011/0004427 A1 | 1/2011 | Gorbold et al. |
| 2013/0026994 A1 | 1/2013 | Morikawa |
| 2014/0167656 A1* | 6/2014 | Yamada .................... H02J 7/00 318/139 |

FOREIGN PATENT DOCUMENTS

| | | | | |
|---|---|---|---|---|
| JP | 2007242529 | * | 9/2007 | ............. H01M 8/04 |
| JP | 2013-029362 A | | 2/2013 | |
| KR | 2004-0001639 A | | 1/2004 | |
| KR | 10-0814883 B1 | | 3/2008 | |
| WO | WO2013031559 | * | 8/2012 | ............. G01R 31/36 |
| WO | 2013/031559 A1 | | 3/2013 | |

\* cited by examiner

| INTERVAL | CHANNEL 1 (START) | CHANNEL 2 | CHANNEL 3 | CHANNEL 4 | · · · · | CHANNEL N (END) |
|---|---|---|---|---|---|---|
| 0CV | +10mV | −13mV | −6mV | +3mV | ~ | +11mV |
| 0~10A | +14mV | +3mV | −9mV | +7mV | ~ | +4mV |
| 10~20A | +8mV | −10mV | −3mV | +5mV | ~ | +8mV |
| ⋮ | ⋮ | ⋮ | ⋮ | ⋮ | ⋮ | ⋮ |
| ⋮ | ⋮ | ⋮ | ⋮ | ⋮ | ⋮ | ⋮ |
| 350~360A | −2mV | −8mV | +9mV | −20mV | ~ | +7mV |

Fig.5

SYSTEM FOR MEASURING A STACK CELL VOLTAGE OF A FUEL CELL AND METHOD THEREOF

CROSS-REFERENCE TO RELATED APPLICATION

This application is based on and claims priority from Korean Patent Application No. 10-2014-0128681, filed on Sep. 25, 2014 in the Korean Intellectual Property Office, the disclosure of which is incorporated herein in its entirety by reference.

TECHNICAL FIELD

The present invention relates to a system and a method for measuring a stack cell voltage of a fuel cell. In particular, the present invention provides a novel technology of accurate measuring a stack cell voltage of a vehicle battery.

BACKGROUND

Vehicles utilizing an internal combustion engine using a gasoline or heavy fuel oil as a main fuel have seriously generated pollution such as air pollution. Accordingly, great efforts have been made recently to develop an electric vehicle or a hybrid vehicle and to reduce such pollution.

The electric vehicle is a vehicle using a battery engine operated by electric energy generated from a battery. Since this electric vehicle uses the battery which includes a number of secondary batteries capable of charging and discharging formed in a single pack as a main power source, exhaust gases may not be generated and noise may be removed.

Meanwhile, the hybrid vehicle is a vehicle between a vehicle using an internal combustion engine and the electric vehicle, and thus, the hybrid vehicle may use power sources in at least two ways. For example, both the internal combustion engine and the battery engine may be used as power source. Currently, a mixed type of hybrid vehicle has been developed, and the mixed type hybrid vehicle may use the internal combustion engine and a fuel cell for directly obtaining electric energy by having a chemical reaction when hydrogen and oxygen is continuously supplied. Alternatively, he mixed type hybrid vehicle may use the battery and the fuel cell.

In the vehicle using the battery engine, the secondary battery may be required substantially to improve the power source, and since a number of connected cells directly influence the performance of the vehicle and the performance of each battery cell needs to be superior, efficient managing the charge/discharge and the life for each of battery cells may be essential by measuring a voltage for each of battery cells, a total battery voltage and current, and the like.

Accordingly, the stack cell voltage of the battery is measured by using a stack voltage monitoring device in a vehicle to manage the battery in a vehicle. Generally, the stack cell voltage is formed by stacking the unit cells of about 300 to 400, and since the measurement for each of unit cells is difficult when the stack cell voltage is measured after defining channels by tying the unit cells in the unit of about 3 to 4, the measurement for each channel may be performed. However, when stacking the unit cells are of about 300 to 400, unit of about 100 or about 200 may be connected and errors may be caused when the voltage for the channel near the connection is measured. In addition, the stack voltage monitoring device for measuring a stack voltage may include a plurality of modules, and due to the resistance value difference between the plurality of modules, the measurement error of the stack cell voltage may occur.

FIG. 1 shows a graph measuring a stack cell voltage for each of channels by a stack voltage monitoring device mounted in a vehicle immediately after manufacturing the vehicle. As shown in FIG. 1, the cell voltage for each of channels is not uniform and errors (A) which the voltage temporally drops occur.

The above information disclosed in this Background section is only for enhancement of understanding of the background of the disclosure and therefore it may contain information that does not form the prior art that is already known in this country to a person of ordinary skill in the art.

SUMMARY OF THE INVENTION

The present invention provides a novel technology capable of eliminating a measurement error of a stack cell voltage occurred initially when manufacturing a fuel cell.

In one aspect, a system for measuring a stack cell voltage of a fuel cell is provided.

In an exemplary embodiment, the system may comprise: a stack voltage measuring unit which measures a stack voltage of a stack cell battery for each channel; a correction variable calculating unit which calculates a correction variable by using the stack voltage value measured by the stack voltage measuring unit; and a stack voltage value correcting unit which corrects the stack voltage measured by the stack voltage measuring unit on driving by using the correction variable.

In particular, the stack voltage measuring unit may transmit a stack voltage value which is measured when a test drive of a vehicle is performed after manufacturing the vehicle to the correction variable calculating unit and transmit a stack voltage value which is measured on driving after the test drive is performed to the stack voltage value correcting unit.

Also, the correction variable calculating unit may calculate an average of the measured stack voltage value received from the stack voltage measuring unit in each predetermined interval, calculate a deviation value as compared to the average for each interval and calculate the correction variable.

In addition, the predetermined interval may be divided by a reference of a stack current.

Moreover, the system may further comprise a storage which may match and store the deviation value as compared to the average for each interval.

The stack voltage value correcting unit may correct the stack voltage which may be measured on driving after the test drive is performed at each predetermined interval by adding or subtracting the stack voltage measured on driving after the test drive is performed and the deviation value.

A method for measuring a stack cell voltage of a fuel cell according to exemplary embodiments of the present invention may comprise steps of: measuring a stack voltage value of a vehicle battery when a test drive of a vehicle is performed after manufacturing the vehicle; calculating a correction variable value by using the stack voltage value measured when the test drive is performed; measuring the stack voltage value of the vehicle on driving after the test drive is performed; and correcting the stack voltage value measured on driving by using the correction variable value.

In the step of calculating the correction variable value, an average of the stack voltage value measured when the test drive is performed in every predetermined interval may be calculated and a deviation value as compared to the average for each interval and the correction variable may be calculated.

In the step of correcting by using the correction variable value, the stack voltage which is measured on driving after the test drive is performed and the deviation value may be corrected at each predetermined interval by adding or subtracting the stack voltage measured on driving after the test drive is performed.

The method may further comprise a step of generating and storing a table by matching the deviation value for each interval as compared to the average value before driving after the test drive is performed.

According to various exemplary embodiments of the present invention, a measurement error of a stack voltage monitoring device may be eliminated and thus, a variation amount of an actual cell performance may be accurately obtained. In addition, it may be determined whether it is a measurement error or an actual cell voltage drop, and thus, precision of the stack voltage monitoring device may be obtained and a breakdown may be repaired immediately.

BRIEF DESCRIPTION OF THE DRAWINGS

The above and other objects, features and advantages of the present invention will be more apparent from the following detailed description taken in conjunction with the accompanying drawings, in which:

FIG. 5 shows an exemplary table storing a correction variable of a stack cell voltage according to an exemplary embodiment of the present invention.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, in order to explain in detail to the extent that the ordinary skilled in the art can easily embody the technical concept of the present invention, the various exemplary embodiment of the present invention will be described with reference to the accompanying drawings.

The present invention provides a novel technology capable of improving the degree of precision of a stack cell measurement value by correcting a measurement error of a stack cell voltage of a vehicle battery.

Hereinafter, with reference to FIG. 2 and FIG. 6, exemplary embodiments of the present invention will be described in detail.

Figure 2:
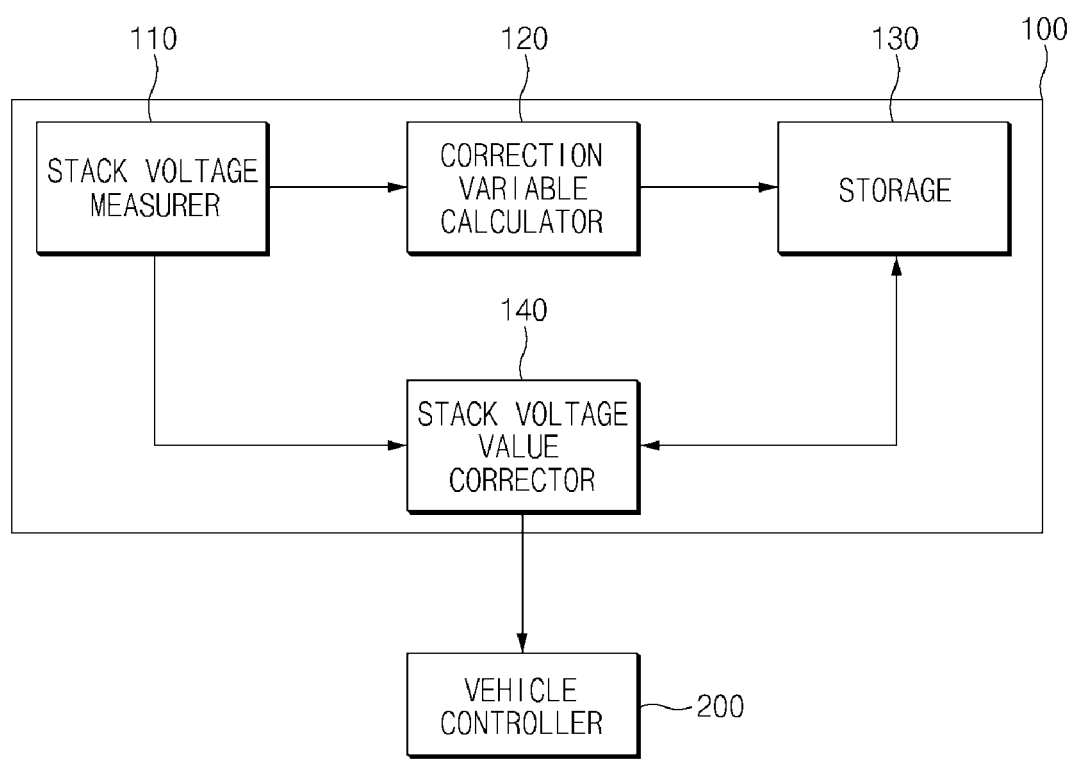
FIG. 2 shows an exemplary configuration diagram of an exemplary system for measuring a stack cell voltage of an exemplary fuel cell according to an exemplary embodiment of the present invention.

FIG. 2 shows an exemplary system for measuring a stack cell voltage of a fuel cell according to an exemplary embodiment of the present invention.

The system 100 for measuring a stack cell voltage of a fuel cell according to an exemplary embodiment of the present invention may include a stack voltage measuring unit 110, a correction variable calculating unit 120, a storage 130 and a stack voltage value correcting unit 140.

The stack voltage measuring unit 110 may measure a stack cell battery of a vehicle battery. The stack cell battery may be formed by stacking a plurality of unit cells, and a channel may be a part which is tied by the unit cells of about 3 to 4. For example, a stack cell battery may be manufactured by stacking the unit cells of about 300 to 400, and the stack voltage measuring unit 110 may measure the stack voltage for each of about 3 to 4 unit cells for each of channels. In particular, the stack voltage measuring unit 110 may measure a stack voltage when a test drive is performed after manufacturing a vehicle, and then periodically may measure a stack voltage on driving to calculate a correction variable initially.

The correction variable calculating unit 120 may calculate the average value of the measurement data in each predetermined stack current interval by using the data measured by the stack voltage measuring unit 110. The correction variable calculating unit 120 may calculate a deviation value for each channel compared to the mean value for each interval. In particular, the correction variable calculating unit 120 may check whether the measurement data of each interval is greater than the average value or not and calculate the deviation value as shown in FIG. 5.

The storage 130 may store the measurement value for each channel of the stack cell battery measured by the stack voltage measuring unit 110, the average value of the stack voltage for each stack current interval calculated by the correction variable calculating unit 120 and the deviation value and the like in a table form as shown in FIG. 5.

The stack voltage value correcting unit 140 may correct the stack voltage value by adding or subtracting the stack voltage for each stack current interval measured by the stack voltage measuring unit 110 and the deviation value stored as the table of FIG. 5. Then, the stack voltage value correcting unit 140 may transmit the corrected stack voltage value to the vehicle controller 200.

The vehicle controlling unit 200 may calculate the voltage deviation between the minimum cell voltage and the average cell voltage by using the corrected stack voltage value and may control the stack current limit range.

According to various exemplary embodiments, when a vehicle is manufactured, the stack voltage may be measured through a test drive, the correction variable value may be calculated and stored, and then the stack voltage measured when driving later by using the correction variable value may be corrected and forwarded to the vehicle controlling unit 200 and the like.

Figure 3:
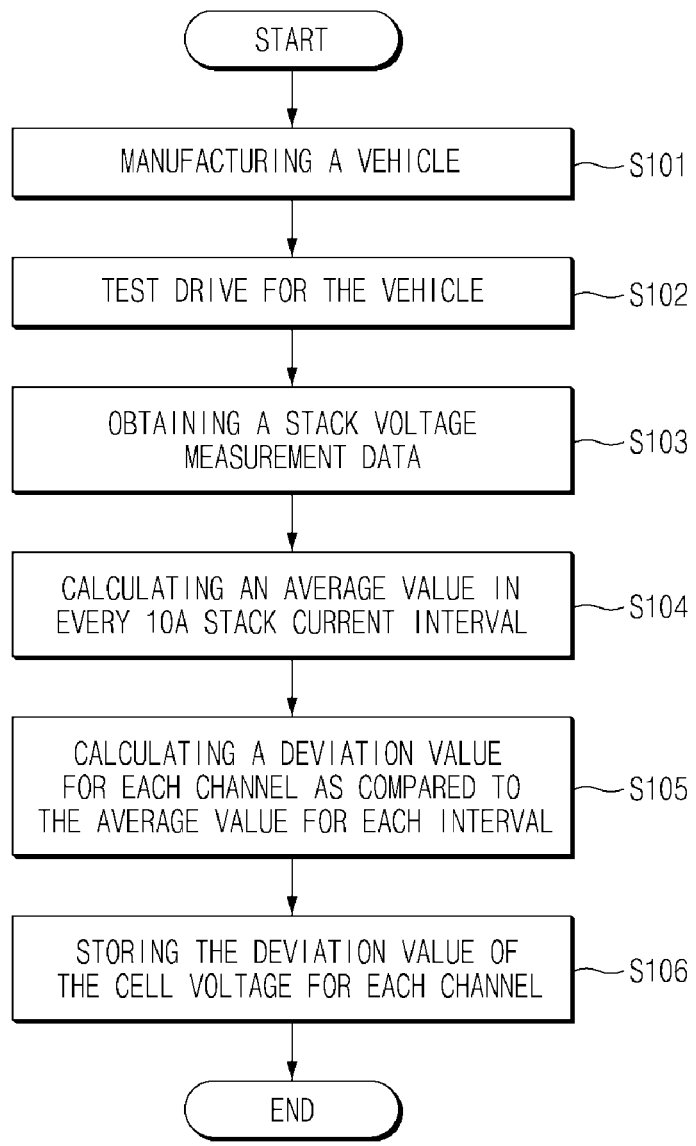
FIG. 3 shows an exemplary method for storing a correction variable of a stack cell voltage according to an exemplary embodiment of the present invention.

In FIG. 3, the method for storing the correction variable of the stack cell voltage according to an exemplary embodiment of the present invention will be described concretely.

First, when a vehicle is manufactured (S101), a test drive may be performed (S102).

When the test drive is performed, the stack voltage measuring unit 110 may measure the stack voltage for each channel of the battery (S103). In particular, any methods applied to measuring stack voltage in the art may be applied for measuring the stack voltage for each channel.

The correction variable calculating unit 120 may calculate the average value for each predetermined interval, for example, the stack current of about 10 A (S104). At this time, as shown in FIG. 5, the interval calculating the average value may be disclosed by being divided in every about 10 A interval such as OCV interval, of about 0 to 10 A interval, of about 10 A to 20 A interval, or up to of about 350 A to 360 A interval. The interval for calculating the average value may be, but not limited to, about 10 A, but it may include variable sets.

Then, the correction variable calculating unit 120 may calculate the deviation value for each channel compared to the average value for each interval (S105). As shown in FIG. 5, the deviation of the channel 1 may be about +10 mV, the deviation of the channel 2 may be about −13 mV, the deviation of the channel 3 may be −6 mV and the deviation of the channel 4 may be about +3 mV. Those variable sets of values may be selected for explanation purpose but may not be considered as limiting the scope of the invention.

Subsequently, the correction variable calculating unit 120 may store the calculated cell voltage deviation value for each channel to the storage 130 (S106).

As the above described, in exemplary embodiments of the present invention, the cell voltage deviation value which is the correction variable through a test drive after manufacturing a vehicle may be calculated and stored.

Figure 4:
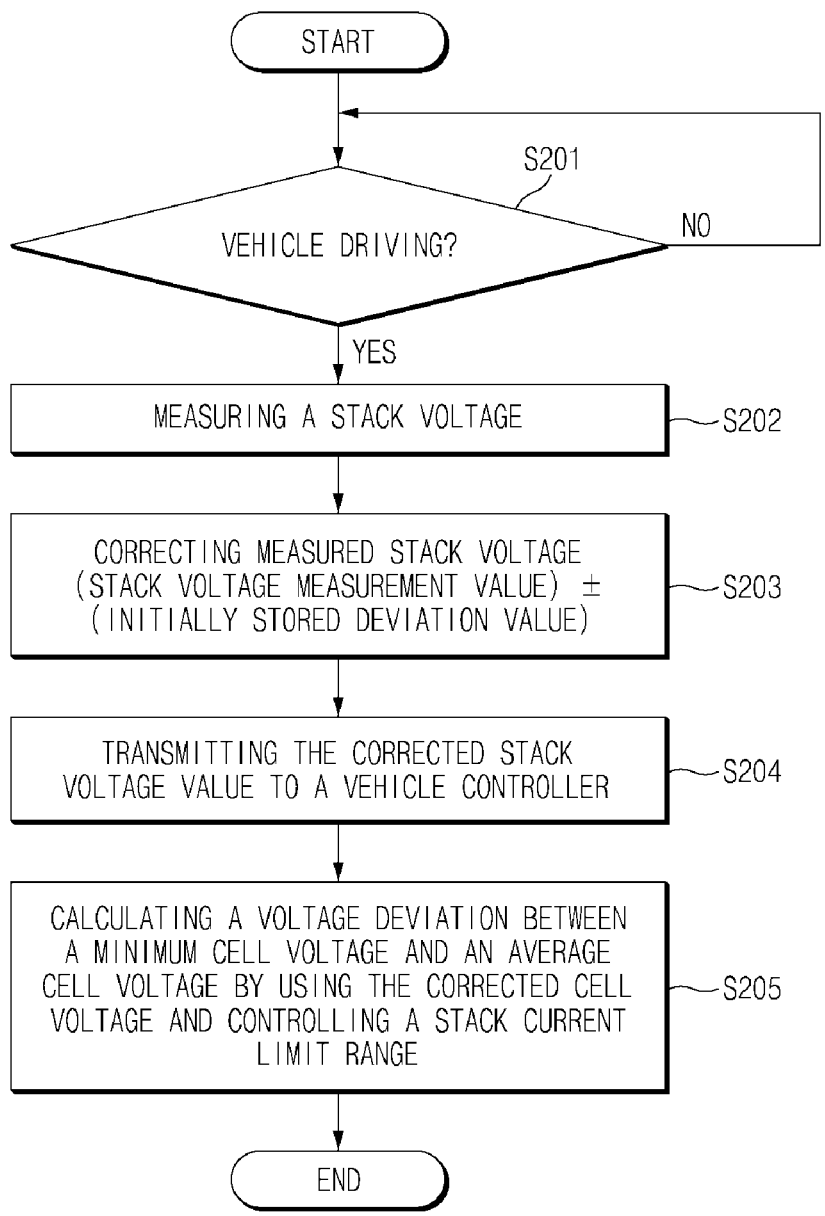
FIG. 4 shows an exemplary method for measuring a stack cell voltage of an exemplary fuel cell by correcting a stack cell voltage according to an exemplary embodiment of the present invention.

In FIG. 4, the method for measuring a stack cell voltage of a fuel cell by correcting the stack cell voltage according to an embodiment of the present invention will be described concretely.

First, when driving is started (S201), the stack voltage measuring unit 110 may measure the stack voltage of the vehicle battery (S202).

Then, the stack voltage value correcting unit 140 may correct the measured stack voltage (S203). In particular, the stack voltage value correcting unit 140 may correct the measured stack voltage by adding or subtracting the stack voltage value measured on driving and the previously stored cell voltage deviation value. For example, in FIG. 5, when the deviation is +10 mV in the OCV interval, the stack voltage value may be corrected by adding about 10 mV to the measured stack voltage value.

Subsequently, the stack voltage value correcting unit 140 may transmit the corrected stack voltage value to the vehicle controller (S204).

Accordingly, the vehicle controlling unit 200 may calculate the voltage deviation between the minimum cell voltage and the average cell voltage by using the corrected stack voltage value, and thus stack current limit range may be adjusted (S205).

As the above described, the present invention may accurately obtain the actual voltage value of the vehicle battery by correcting the measurement error from the measured stack voltage value, and thus accurately control according to the current state of the vehicle battery during controlling the vehicle due to the accurate voltage value measurement for the vehicle battery.

Figure 1:
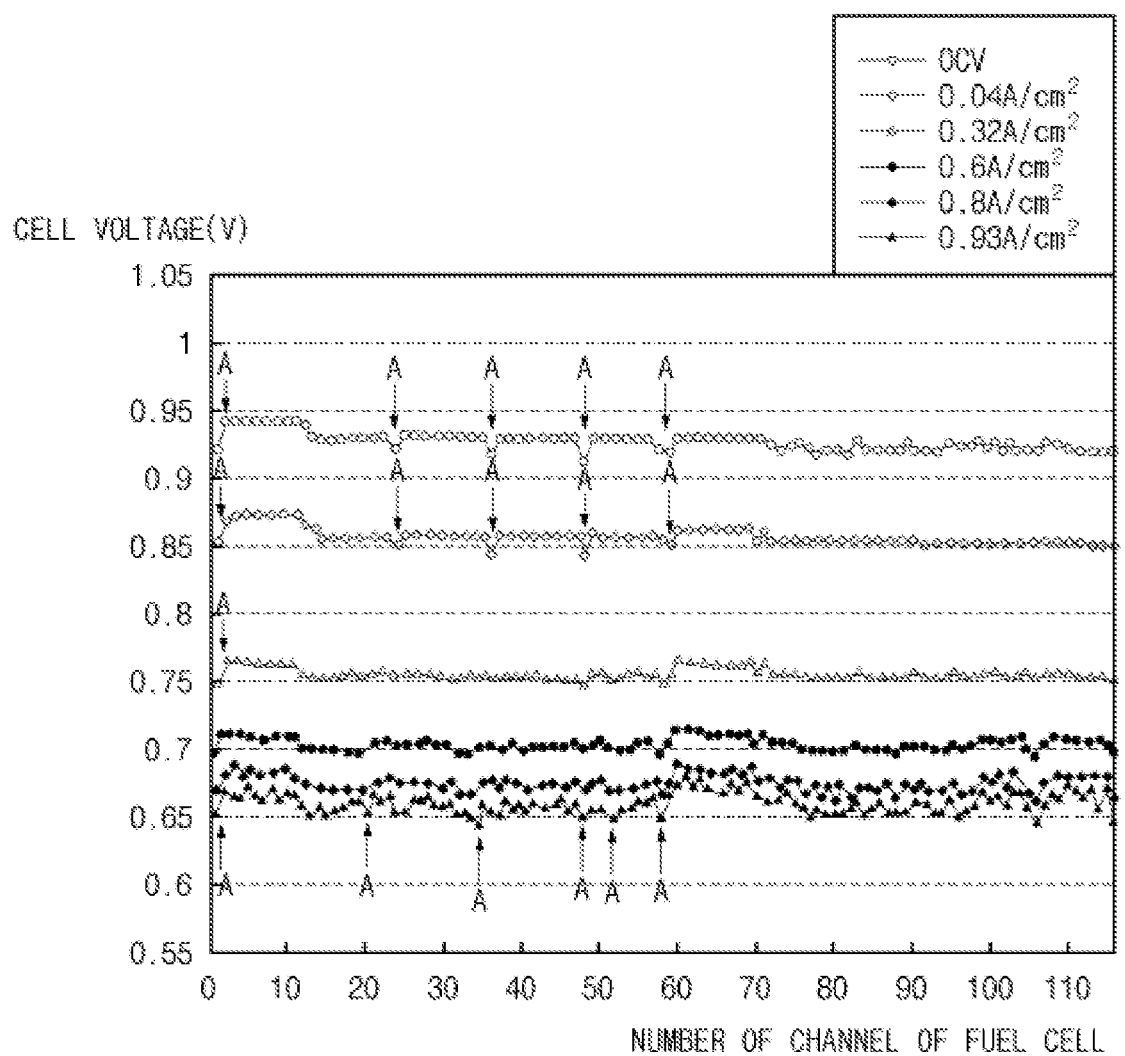
FIG. 1 shows a measurement value of a stack cell voltage for each of channels of a conventional vehicle battery in the related arts.
Figure 6:
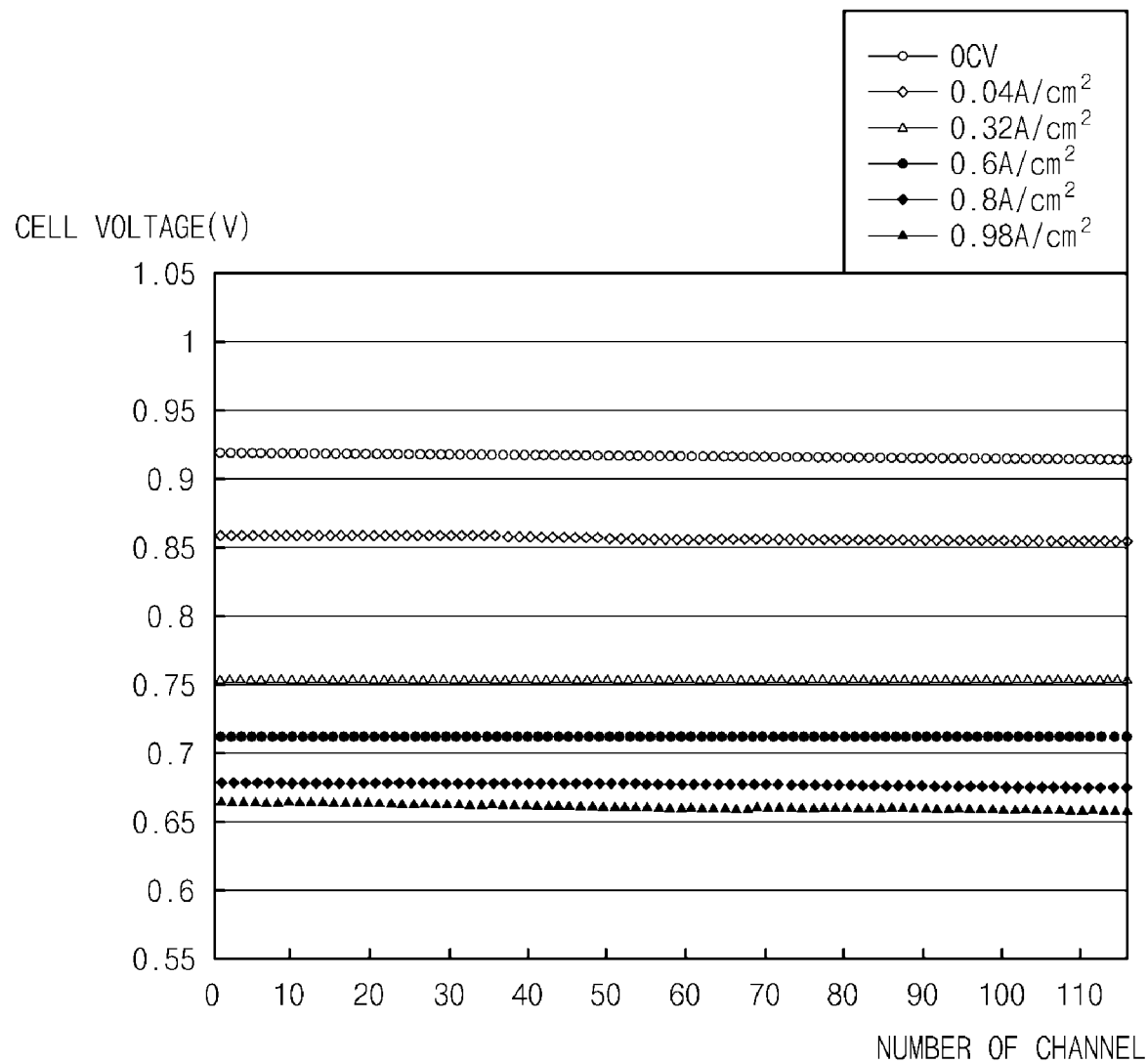
FIG. 6 shows an exemplary correction value of a stack cell voltage for each channel of a vehicle battery according to an exemplary embodiment of the present invention.

FIG. 6 shows an exemplary correction value of a stack cell voltage for each of channels of a vehicle battery according to an exemplary embodiment of the present invention. At this time, each graph shows that the cell voltage may be dropped from OCV state as the current amount increases while the vehicle runs. At this time, as compared to FIG. 1, the stack cell voltage measured for each channel may be uniform without any measurement error.

The various exemplary embodiment of the present invention as the above described is for purposes of illustration, through the spirit and scope of the appended claims, various modifications, changes, substitutions and the addition, change, etc. can be made by the ordinary skilled in the art, and it is construed that the following claims includes these modifications, variations, etc.

What is claimed is:

1. A system for measuring a stack cell voltage of a fuel cell, comprising:
    a stack voltage measuring unit specifically programmed to measure a first stack voltage of a stack cell battery for each channel in a first driving condition performing a first test drive after the vehicle is manufactured and measures a second stack voltage of the stack cell battery for each channel in a second driving condition after the test driving is performed;
    a correction variable calculating unit specifically programmed to calculate a correction variable by using the first stack voltage value measured by the stack voltage measuring unit during the first driving condition; and
    a stack voltage value correcting unit specifically programmed to correct the second stack voltage measured by the stack voltage measuring unit during the second driving condition by using the correction variable,
    wherein the correction variable calculating unit specifically programmed to calculate an average of the first stack voltage value received from the stack voltage measuring unit in each predetermined interval, calculates a deviation value as compared to the average for each interval and calculates the correction variable,
    wherein the stack voltage measuring unit is specifically programmed, to transmit the first stack voltage value measured when the test drive of the vehicle is performed after manufacturing the vehicle to the correction variable calculating unit, and transmit the second stack voltage value measured on driving after the test drive is performed to the stack voltage value correcting unit.

2. A system for measuring a stack cell voltage of a fuel cell according to claim 1, wherein the predetermined interval is divided by a reference of a stack current.

3. A system for measuring a stack cell voltage of a fuel cell according to claim 1, wherein the system further comprises a storage which matches and stores the deviation value as compared to the average for each interval.

4. A system for measuring a stack cell voltage of a fuel cell according to claim 1, wherein the stack voltage value correcting unit is specifically programmed to correct the second stack voltage measured on driving after the test drive is performed for each predetermined interval by adding or subtracting the second stack voltage measured on driving after the test drive is performed and the deviation value.

\* \* \* \* \*